United States Patent [19]

De Keyzer et al.

[11] Patent Number: 5,200,294

[45] Date of Patent: Apr. 6, 1993

[54] METHOD FOR MAKING A LITHOGRAPHIC PRINTING PLATE ACCORDING TO THE SILVER SALT DIFFUSION TRANSFER PROCESS

[75] Inventors: René M. De Keyzer, Sint-Niklaas; Jean-Marie O. Dewanckele, Drongen; Ludo L. Van Rompuy, Destelbergen; Jos A. Vaes, Betekom, all of Belgium

[73] Assignee: Agfa-Gevaert, N.V., Mortsel, Belgium

[21] Appl. No.: 810,150

[22] Filed: Dec. 19, 1991

[51] Int. Cl.$^5$ ................................................. G03C 8/32
[52] U.S. Cl. ................................. 430/204; 430/234; 430/251; 430/302
[58] Field of Search .............. 430/204, 234, 251, 302

[56] References Cited

U.S. PATENT DOCUMENTS

| | | | |
|---|---|---|---|
| 4,230,792 | 10/1980 | Tsubai et al. | 430/302 |
| 4,632,896 | 12/1986 | Tsubai et al. | 430/251 |
| 4,960,683 | 10/1990 | Okazaki et al. | 430/428 |

Primary Examiner—Charles L. Bowers, Jr.
Assistant Examiner—Mark F. Huff
Attorney, Agent, or Firm—Breiner & Breiner

[57] ABSTRACT

According to the present invention there is provided a method for making a lithographic printing plate according to the DTR-process comprising the steps of:

information-wise exposing an imaging element comprising on a support a silver halide emulsion layer and an image-receiving layer containing physical development nuclei and developing said information-wise exposed imaging element with an alkaline processing liquid in the presence of developing agent(s), silver halide solvent(s) and hydrophobizing agent(s) characterized in that said hydrophobizing agent(s) are present in said alkaline processing liquid in a total amount of at least 0.1 g/l and wherein at least one of said silver halide solvents is a compound corresponding to the following formula:

$$Z-(R^1-S)_t-R^2-S-R^3-Y \qquad (I)$$

wherein Z and Y each independently represents hydrogen, an alkyl group, an amino group, and ammonium group, a hydroxyl, a sulfo group, a carboxyl, an amino carbonyl or an aminosulfonyl, $R^1$, $R^2$ and $R^3$ each independently represents an alkylene that may be substituted and optionally contain a oxygen bridge and t represents an integer from 0 to 10.

6 Claims, No Drawings

METHOD FOR MAKING A LITHOGRAPHIC PRINTING PLATE ACCORDING TO THE SILVER SALT DIFFUSION TRANSFER PROCESS

DESCRIPTION

1. Field of the invention.

The present invention relates to a method for making a lithographic printing plate according to the silver salt diffusion transfer process.

2. Background of the invention.

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Wedye-The Focal Press-London and New York, (1972).

In the DTR-process non-developed silver halide of an information-wise exposed photographic silver halide emulsion layer material is transformed with a so-called silver halide solvent into soluble silver complex compounds which are allowed to diffuse into an image-receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellant ink-receptive areas on a water-receptive ink-repellant background. For example, typical lithographic printing plates are disclosed e.g. EP-A-423399 and EP-A-410500.

The DTR-image can be formed in the image-receiving layer of a sheet or web material which is a separate element with respect to the photographic silver halide emulsion material (a so-called two-sheet DTR element) or in the image-receiving layer of a so-called single-support-element, also called mono-sheet element, which contains at least one photographic silver halide emulsion layer integral with an image-receiving layer in waterpermeable relationship therewith. It is the latter mono-sheet version which is preferred for the preparation of offset printing plates by the DTR method.

As for other printing plates it is required that the printing plates obtained according to the DTR-process have a high printing endurance, good ink acceptance in the printing areas and no ink acceptance in the non-printing areas (no staining). It is furthermore desirable that the number of copies that have to be disposed of because of ink acceptance in the non-printing areas (so called toning) during start-up of the printing process is limited. With respect to these requirements the state of the transferred silver i.e. the silver formed in the image-receiving layer plays a very important role. Parameters that are known to control the state of the transferred silver are e.g. the rate of development of the exposed silver halide (chemical development), rate of dissolution of the non-exposed silver halide by the silver halide solvent(s), rate of diffusion of the silver halide complexes, rate of development of the silver halide complexes in the image receiving layer (physical development) etc.. Although other factors such as for example the plate construction have an influence on the aforementioned parameters the type of silver halide solvent influences most of the mentioned parameters to a large extent.

A further parameter for improving the printing properties of the printing plate especially printing endurance and staining is the differentiation between the hydrophobicity of the silver image and the hydrophilic background. To improve the hydrophobicity hydrophobizing agents are usually added to one or more processing liquids used for preparing the lithographic printing plate. However when these agents are used in large amounts heavy toning of the printing plate occurs.

SUMMARY OF THE INVENTION

It is an object of the present invention to provide a method for making a lithographic printing plate according to the DTR-process having good printing properties i.e. good ink acceptance in the printing areas, no ink acceptance in the non-printing areas and a high printing endurance.

Further objects of the present invention will become clear from the description hereinafter.

According to the present invention there is provided a method for making a lithographic printing plate according to the DTR-process comprising the steps of:

information-wise exposing an imaging element comprising on a support a silver halide emulsion layer and an image-receiving layer containing physical development nuclei and developing said information-wise exposed imaging element with an alkaline processing liquid in the presence of developing agent(s), silver halide solvent(s) and hydrophobizing agent(s) characterized in that said hydrophobizing agent(s) are present in said alkaline processing liquid in a total amount of at least 0.1 g/l and wherein at least one of said silver halide solvents is a compound corresponding to the following formula:

$$Z-(R^1-S)_t-R^2-S-R^3-Y \qquad (I)$$

wherein Z and Y each independently represents hydrogen, an alkyl group, an amino group, an ammonium group, a hydroxyl, a sulfo group, a carboxyl, an aminocarbonyl or an aminosulfonyl, $R^1$, $R^2$ and $R^3$ each independently represents an alkylene that may be substituted and optionally contain a oxygen bridge and t represents an integer from 0 to 10.

DETAILED DESCRIPTION OF THE INVENTION

After extensive research it has been found that lithographic printing plates with good printing properties can be obtained when an informationwise exposed imaging element comprising on a support a silver halide emulsion layer and image-receiving layer containing physical development nuclei is developed with an alkaline processing liquid in the presence of developing agent(s) and a silver halide solvent corresponding to formula (I) and a hydrophobizing agent present in said alkaline processing liquid in a concentration of at least 0.1 g/l. Printing plates with excellent ink acceptance in the printing areas and no ink acceptance in the non-printing areas are obtained. Furthermore, good copies are obtained from the start of the printing process so that only a limited number of copies have to be disposed of during start-up of the printing process.

Silver halide solvents suitable for use in accordance with the present invention can be found in e.g. U.S. Pat. No. 4,960,683. Specific examples are listed in table 1

TABLE 1

| | |
|---|---|
| $(HO-CH_2-CH_2)_2S$ | 1 |
| $HO-CH_2-CH_2-S-CH_2-S-CH_2-CH_2-OH$ | 2 |
| $HO-CH_2-CH_2-S-(CH_2)_2-S-CH_2-CH_2-OH$ | 3 |
| $HO-CH_2-CH_2-S-(CH_2)_3-S-CH_2-CH_2-OH$ | 4 |
| $HO-CH_2-CH_2-S-(CH_2)_4-S-CH_2-CH_2-OH$ | 5 |
| $C_2H_5-S-CH_2-CH_2-S-CH_2-CHOH-CH_2-OH$ | 6 |
| $(HOCH_2-CH_2-S-CH_2-CH_2)_2O$ | 7 |
| $HO-CH_2-CH_2-S-CH_2-CH_2-N(CH_3)_2$ | 8 |
| $(HO-CH_2-CHOH-CH_2-S-CH_2)_2$ | 9 |
| $HOOC-CH_2-S-CH_2-S-CH_2-COOH$ | 10 |
| $HOOC-CH_2-S-(CH_2)_2-S-CH_2-COOH$ | 11 |
| $HOOC-CH_2-S-(CH_2)_3-S-CH_2-COOH$ | 12 |
| $HOOC-(CH_2)_2-S-CH_2-S-(CH_2)_2-COOH$ | 13 |
| $HOOC-(CH_2)_2-S-(CH_2)_2-S-(CH_2)_2-COOH$ | 14 |
| $HOOC-(CH_2)_2-S-(CH_2)_3-S-(CH_2)_2-COOH$ | 15 |
| $CH_3-S-CH_2-CH_2-\underset{NH_2}{CH}-COOH$ | 16 |

The above silver halide solvents corresponding to formula (I) are preferably used in the alkaline processing liquid in a concentration between 0.1% and 5% by weight when used as the only silver halide solvent. When the compounds of formula (I) are used in combination with other silver halide solvents the concentration may be lowered to e.g. 0.05% by weight. Said silver halide solvents according to formula (I) may also be contained at least partially in one or more layers of the imaging element.

Especially suitable silver halide solvents for use in combination with the silver halide solvents of formula (I) are alkanolamines. Alkanolamines that are suitable for use in accordance with the present invention may be of the tertiary, secundary or primary type. Examples of alkanolamines that may be used in connection with the present invention correspond to the following formula:

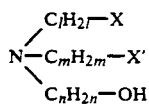

wherein X and X' independently represent hydrogen, a hydroxyl group or an amino group, l and m represent 0 or integers of 1 or more and n represents an integer of 1 or more. Preferably used alkanolamines are e.g. N-(2-aminoethyl)ethanolamine, diethanolamine, N-methylethanolamine, triethanolamine, N-ethyldiethanolamine, diisopropanolamine, ethanolamine, 4-aminobutanol, N,N-dimethylethanolamine, 3-aminopropanol, N,N-ethyl-2,2'-iminodiethanol etc. or mixtures thereof.

According to the present invention the alkanolamines are preferably present in the alkaline processing liquid in a concentration preferably between 0.1% and 5% by weight. However part or all of the alkanolamine can be present in one or more layers of the imaging element.

Other silver halide solvents suitable for use in combination with the silver halide solvent corresponding to formula (I) are e.g. 2-mercaptobenzoic acid, cyclic imides, oxazolidones and thiosulfates in amounts between 0.01% and 1% by weight in the alkaline processing liquid.

The hydrophobizing agents used in connection with the present invention are compounds that are capable of reacting with silver or silver ions and that are hydrophobic i.e. insoluble in water or only slightly soluble in water. Generally these compounds contain a mercapto group or thiolate group and one or more hydrophobic substituents e.g. an alkyl containing at least 3 carbon atoms. Examples of hydrophobizing agents for use in accordance with the present invention are e.g. those described in U.S. Pat. No. 3,776,728, and U.S. Pat. No. 4,563,410. Preferred correspond to one of the following formulas:

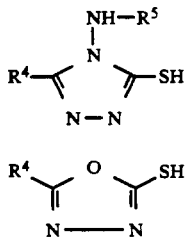

wherein $R^5$ represents hydrogen or an acyl group, $R^4$ represents alkyl, aryl or aralkyl. Most preferably used compounds are compounds according to one of the above formulas wherein $R^4$ represents an alkyl containing 3 to 16 C-atoms.

According to the present invention the hydrophobizing agents are contained in the alkaline processing liquid in an amount of at least 0.1 g/l, more preferably at least 0.2 g/l and most preferably at least 0.3 g/l. The maximum amount of hydrophobizing agents will be determined by the type of hydrophobizing agent, type and amount of silver halide solvents etc.. Typically the concentration of hydrophobizing agent is preferably not more than 1.5 g/l and more preferably not more than 1 g/l. It is a particular advantage of the present invention that the compounds according to formula (I) as silver halide complexing agents allow hydrophobizing agents to be used in substantial larger concentrations as in case other complexing agents such as e.g. thiocyanate are used so that the hydrophobicity of the silver image can be improved without substantially increasing staining and toning of the printing plate.

The alkaline processing liquid used in accordance with the present invention preferably has a pH between 10 and 13. Said pH may be established by an organic or inorganic alkaline substance or a combination thereof. Suitable inorganic alkaline substances are e.g. potassium or sodium hydroxide, carbonate, phosphate etc.. Suitable organic alkaline substances are e.g. alkanolamines. In the latter case the alkanolamines will provide or help providing the pH and serve as a silver halide complexing agent.

The alkaline processing liquid may also contain the developing agent(s) used in accordance with the present invention. In this case the alkaline processing liquid is called a developer. On the other hand some or all of the developing agent(s) may be present in one or more layers of the imaging element. When all of the developing agents are contained in the imaging element the alkaline processing liquid is called an activator or activating liquid.

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidinone-type developing agent and/or p-monomethylaminophenol. Particularly useful auxiliary developing agents are of the phenidone type e.g. 1-phenyl-3-pyrazolidinone, 1-phenyl-4-monomethyl-3-pyrazolidinone, and 1-phenyl-4,4-dimethyl-3-pyrazolidinone. However other developing agents can be used.

The alkaline processing liquid preferably also contains a preserving agent having antioxidation activity, e.g. sulphite ions provided e.g. by sodium or potassium sulphite. For example, the aqueous alkaline solution comprises sodium sulphite in an amount ranging from 0.15 to 1.0 mol/l. Further may be present a thickening agent, e.g. hydroxyethylcellulose and carboxymethylcellulose, fog inhibiting agents, e.g. potassium bromide, potassium iodide and a benzotriazole which is known to improve the printing endurance, calcium-sequestering compounds, anti-sludge agents, and hardeners including latent hardeners.

Development acceleration can be accomplished with the aid of various compounds to the alkaline processing liquid and/or one or more layers of the photographic element, preferably polyalkylene derivatives having a molecular weight of at least 400 such as those described in e.g. U.S. Pat. Nos. 3,038,805-4,038,075-4,292,400-4,975,354.

Preferably the processing of the information-wise exposed imaging element is carried out in the presence of so called regulating compounds that influence the state of the silver image precipitated in the image receiving layer. Examples of regulating compounds suitable for use in accordance with the present invention are e.g. triazoles substituted with a mercapto group or thiolate group and meso-ionic compounds comprising a thiolate as described in e.g. EP-A-431568 especially the meso-ionic triazolium thiolate. Specific regulating compounds suitable for use in accordance with the present invention are:

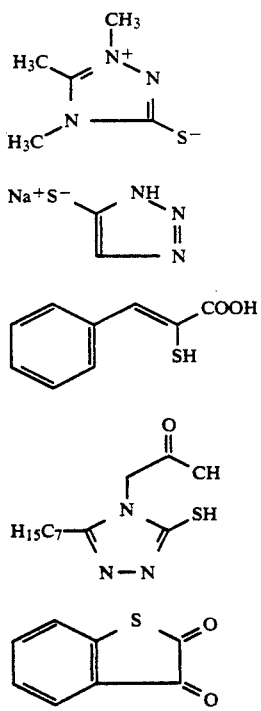

The above described regulating compounds are also suitable for use in combination with other silver halide solvents than the silver halide solvents according to the invention i.e. the silver halide solvents of formula (I) and can be present in the alkaline processing liquid and/or one or more layers of the imaging element.

According to the preferred mode of the present invention an imaging element is used comprising on a support in the order given a silver halide emulsion layer and an image receiving layer containing physical development nuclei. According to the present invention said imaging element is information-wise exposed in an apparatus according to its particular application, e.g. a conventional process camera containing a conventional light source or a laser containing device. Examples of HeNe laser containing exposure units are the image-setters LINOTRONIC 300, marketed by LINOTYPE Co, and CG 9600, marketed by AGFA COMPUGRAPHIC, a division of AGFA CORPORATION. An image-setter provided with an Ar ion laser is LS 210, marketed by Dr-Ing RUDOLF HELL GmbH. Exposure units provided with a laserdiode are LINOTRONIC 200, marketed by LINOTYPE Co, and CG 9400, marketed by AGFA COMPUGRAPHIC, a division of AGFA CORPORATION. The thus obtained information-wise exposed imaging element is subsequently developed using an alkaline processing liquid as described above. Said development step is preferably followed by a neutralization of the surface of the imaged element by guiding the element through a neutralization liquid having a pH between 5 and 7. The neutralization liquid preferably contains a buffer e.g. a phosphate buffer, a citrate buffer or mixture thereof. The neutralization solution can further contain bactericides, e.g. phenol, thymol or 5-bromo-5-nitro-1,3-dioxan as described in EP 0,150,517. The liquid can also contain substances which influence the hydrophobic/hydrophilic balance of the printing plate obtained after processing of the DTR element, e.g. silica. Finally the neutralization solution can contain wetting agents, preferably compounds containing perfluorinated alkyl groups.

Supports suitable for use in accordance with the present invention may be opaque or transparent, e.g. a paper support or resin support. When a paper support is used preference is given to one coated at one or both sides with an Alpha-olefin polymer, e.g. a polyethylene layer which optionally contains an anti-halation dye or pigment. It is also possible to use an organic resin support e.g. cellulose nitrate film, cellulose acetate film, poly(vinyl acetal) film, polystyrene film, poly(ethylene terephthalate) film, polycarbonate film, polyvinylchloride film or poly-Alpha-olefin films such as polyethylene or polypropylene film. The thickness of such organic resin film is preferably comprised between 0.07 and 0.35 mm. These organic resin supports are preferably coated with a hydrophilic adhesion layer which can contain water insoluble particles such as silica or titanium dioxide. Metal supports e.g. aluminium may also be used in accordance with the present invention.

The image receiving layer containing physical development nuclei used in accordance with the present invention is preferably free of hydrophilic binder but may comprise small amounts upto 30% by weight of the total weight of said layer of a hydrophilic colloid e.g. polyvinyl alcohol to improve the hydrophilicity of the surface. Preferred development nuclei for use in accordance with the present invention are sulphides of heavy metals e.g. sulphides of antimony, bismuth, cadmium, cobalt, lead, nickel, palladium, platinum, silver, and zinc. Especially suitable development nuclei in connection with the present invention are palladium sulphide nuclei. Other suitable development nuclei are salts such as e.g. selenides, polyselenides, polysulphides, mercaptans, and tin (II) halides. Heavy metals, preferably silver, gold, platinum, palladium, and mercury can be used in colloidal form.

The photographic silver halide emulsion(s) used in accordance with the present invention can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

The photographic silver halide emulsions used according to the present invention can be prepared by mixing the halide and silver solutions in partially or fully controlled conditions of temperature, concentrations, sequence of addition, and rates of addition. The silver halide can be precipitated according to the single-jet method or the double-jet method.

The silver halide particles of the photographic emulsions used according to the present invention may have a regular crystalline form such as a cubic or octahedral form or they may have a transition form. They may also have an irregular crystalline form such as a spherical form or a tabular form, or may otherwise have a composite crystal form comprising a mixture of said regular and irregular crystalline forms.

According to the present invention the emulsion or emulsions preferably consist principally of silver chloride while a fraction of silver bromide is present ranging from 1 mole % to 40 mole %. The emulsions preferably belong to the core/shell type well known to those skilled in the art in the sense that substantially all the bromide is concentrated in the core. This core contains preferably 10 to 40 % of the total silver halide precipitated, while the shell consists preferably of 60 to 90% of the total silver halide precipitated.

The average size of the silver halide grains may range from 0.10 to 0.70 $\mu$m, preferably from 0.25 to 0.45 $\mu$m.

The size distribution of the silver halide particles of the photographic emulsions to be used according to the present invention can be homodisperse or heterodisperse. A homodisperse size distribution is obtained when 95% of the grains have a size that does not deviate more than 30% from the average grain size.

Preferably during the precipitation stage Iridium and/or Rhodium containing compounds or a mixture of both are added. The concentration of these added compounds ranges from $10^{-8}$ to $10^{-3}$ mole per mole of $AgNO_3$, preferably between $10^{-7}$ and $10^{-6}$ mole per mole of $AgNO_3$. This results in the building the silver halide crystal lattice of minor amounts of Iridium and/or Rhodium, so-called Iridium and/or Rhodium dopants. As known to those skilled in the art numerous scientific and patent publications disclose the addition of Iridium or Rhodium containing compounds or compounds containing other elements of Group VIII of the Periodic System during emulsion preparation.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P 493,464 and 568,687, and polyamines such as diethylene triamine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65-72 (1951).

The emulsions of the DTR element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

In the case of a conventional light source, e.g. tungsten light, a green sensitizing dye is needed. A preferred green sensitizing dye in connection with the present invention is represented by the following chemical formula:

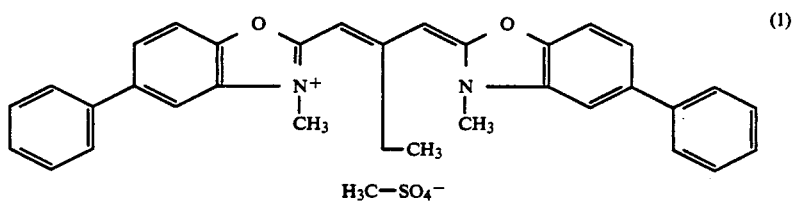

(1)

In case of exposure by a red light emitting source, e.g. a LED or a HeNe laser a red sensitizing dye is used. A preferred red sensitizing dye is:

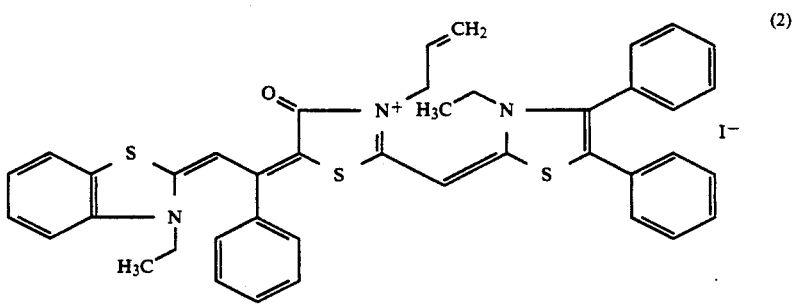

In case of exposure by an argon ion laser a blue sensizing dye is incorporated. A preferred blue sensitizing dye is represented by:

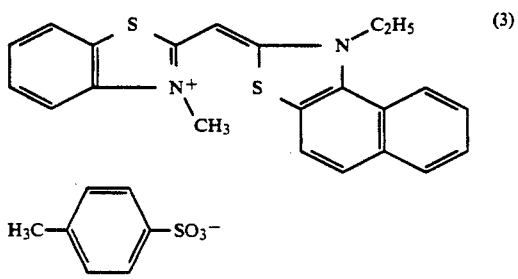

In case of exposure by a semiconductor laser special spectral sensitizing dyes suited for the near infra-red are required. Suitable infra-red sensitizing dyes are disclosed in i.a. U.S. Pat. Nos. 2,095,854, 2,095,856, 2,955,939, 3,482,978, 3,552,974, 3,573,921, 3,582,344, 3,623,881 and 3,695,888. A preferred infra-red sensitizing dye is:

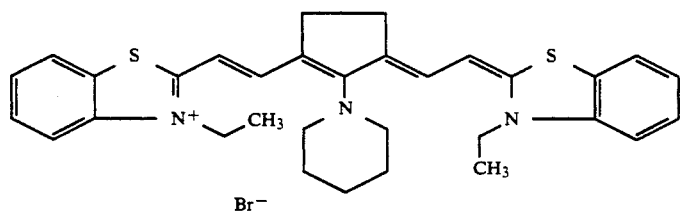

To enhance the sensitivity in the near infra-red region use can be made of so-called supersensitizers in combination with infra-red sensitizing dyes. Suitable supersensitizers are described in Research Disclosure Vol 289, May 1988, item 28952. A preferred supersensitizer is Compound IV of the Disclosure having following formula:

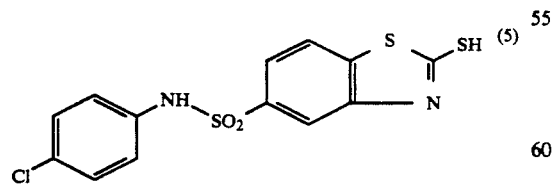

The spectral sensitizers can be added to the photographic emulsions in the form of an aqueous solution, a solution in an organic solvent or in the form of a dispersion.

The silver halide emulsions may contain the usual stabilizers e.g. homopolar or salt-like compounds of mercury with aromatic or heterocyclic rings such as mercaptotriazoles, simple mercury salts, sulphonium mercury double salts and other mercury compounds. Other suitable stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2-27 (1952). Other suitable stabilizers are i.a. heterocyclic mercapto compounds e.g. phenylmercaptotetrazole, quaternary benzothiazole derivatives, and benzotriazole. Preferred compounds are mercapto substituted pyrimidine derivatives as disclosed in U.S. Pat. No. 3,692,527.

The silver halide emulsions may contain pH controlling ingredients. Preferably the emulsion layer is coated at a pH value below the isoelectric point of the gelatin to improve the stability characteristics of the coated layer. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. No. 4,092,168, U.S. Pat. No. 4,311,787, DE-P 2,453,217, and GB-P 7,907,440.

In an especially preferred embodiment the emulsion layer contained in the imaging element contains a compound which comprises in its molecular structure a group capable of adsorbing to silver halide and a group capable of reducing silver halide. Compounds of this kind have been disclosed in EP-A-449340. In this way a combination of a stabilizing and a development activating function in one compound is achieved. A preferred compound belonging to this class is represented by the following formula:

(6)

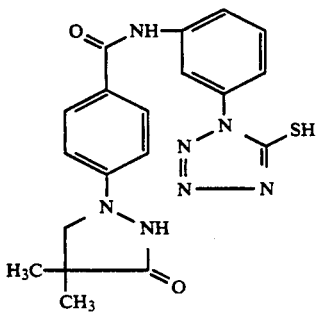

More details about the composition, preparation and coating of silver halide emulsions can be found in e.g. Product Licensing Index, Vol. 92, Dec. 1971, publication 9232, p. 107–109.

In addition to the above described emulsion layer and image receiving layer other hydrophilic colloid layers in water permeable relationship with these layers may be present. For example it is especially advantageous to include a base-layer between the support and the photosensitive silver halide emulsion layer. In a preferred embodiment of the present invention said base-layer serves as an antihalation layer. This layer can therefore contain the same light-absorbing dyes as described above for the emulsion layer; as alternative finely divided carbon black can be used for the same antihalation purposes as described in U.S. Pat. No. 2,327,828. On the other hand, in order to gain sensitivety, light reflecting pigments, e.g. titaniumdioxide can be present. Further this layer can contain hardening agents, matting agents, e.g. silica particles, and wetting agents. At least part of these matting agents and/or light reflection pigments may also be present in the silver halide emulsion layer the most part however preferably being present in said base-layer. As a further alternative the light reflecting pigments may be present in a separate layer provided between the antihalation layer and the photosensitive silver halide emulsion layer.

In a preferred embodiment in connection with the present invention a backing layer is provided at the non-light sensitive side of the support. This layer which can serve as anti-curl layer can contain i.a. matting agents e.g. silica particles, lubricants, antistatic agents, light absorbing dyes, opacifying agents, e.g. titanium oxide and the usual ingredients like hardeners and wetting agents. The backing layer can consist of one single layer or a double layer pack.

The hydrophilic layers usually contain gelatin as hydrophilic colloid binder. Mixtures of different gelatins with different viscosities can be used to adjust the rheological properties of the layer. Like the emulsion layer the other hydrophilic layers are coated preferably at a pH value below the isoelectric point of the gelatin. But instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.

The hydrophilic layers of the photographic element, especially when the binder used is gelatin, can be hardened with appropriate hardening agents such as those of the epoxide type, those of the ethylenimine type, those of the vinylsulfone type e.g. 1,3-vinylsulphonyl-2-propanol, methylenebis(sulfonylethylene), chromium salts e.g. chromium acetate and chromium alum, aldehydes e.g. formaldehyde, glyoxal, and glutaraldehyde, N-methylol compounds e.g. dimethylolurea and methyloldimethylhydantoin, dioxan derivatives e.g. 2,3-dihydroxy-dioxan, active vinyl compounds e.g. 1,3,5-triacryloyl-hexahydro-s-triazine, active halogen compounds e.g. 2,4-dichloro-6-hydroxy-s-triazine, and mucohalogenic acids e.g. mucochloric acid and mucophenoxychloric acid. These hardeners can be used alone or in combination. The binders can also be hardened with fast-reacting hardeners such as carbamoylpyridinium salts of the type, described in U.S. Pat. No. 4,063,952.

Preferably used hardening agents are of the aldehyde type. The hardening agents can be used in wide concentration range but are preferably used in an amount of 4% to 7% of the hydrophilic colloid. Different amounts of hardener can be used in the different layers of the imaging element or the hardening of one layer may be adjusted by the diffusion of a hardener from another layer.

The imaging element used according to the present invention may further comprise various kinds of surface-active agents in the photographic emulsion layer or in at least one other hydrophilic colloid layer. Suitable surface-active agents include non-ionic agents such as saponins, alkylene oxides e.g. polyethylene glycol, polyethylene glycol/polypropylene glycol condensation products, polyethylene glycol alkyl ethers or polyethylene glycol alkylaryl ethers, polyethylene glycol esters, polyethylene glycol sorbitan esters, polyalkylene glycol alkylamines or alkylamides, silicone-polyethylene oxide adducts, glycidol derivatives, fatty acid esters of polyhydric alcohols and alkyl esters of saccharides; anionic agents comprising an acid group such as a carboxy, sulpho, phospho, sulphuric or phosphoric ester group; ampholytic agents such as aminoacids, aminoalkyl sulphonic acids, aminoalkyl sulphates or phosphates, alkyl betaines, and amine-N-oxides; and cationic agents such as alkylamine salts, aliphatic, aromatic, or heterocyclic quaternary ammonium salts, aliphatic or heterocyclic ring-containing phosphonium or sulphonium salts. Preferably compounds containing perfluorinated alkyl groups are used. Such surface-active agents can be used for various purposes e.g. as coating aids, as compounds preventing electric charges, as compounds improving slidability, as compounds facilitating dispersive emulsification and as compounds preventing or reducing adhesion.

The photographic material of the present invention may further comprise various other additives such as e.g. compounds improving the dimensional stability of the photographic element, UV-absorbers, spacing agents and plasticizers.

Suitable additives for improving the dimensional stability of the photographic element are e.g. dispersions of a water-soluble or hardly soluble synthetic polymer e.g. polymers of alkyl (meth)acrylates, alkoxy(meth)acrylates, glycidyl (meth)acrylates, (meth)acrylamides, vinyl esters, acrylonitriles, olefins, and styrenes, or copolymers of the above with acrylic acids, methacrylic acids, Alpha-Beta-unsaturated dicarboxylic acids, hydroxyalkyl (meth)acrylates, sulphoalkyl (meth)acrylates, and styrene sulphonic acids.

According to another embodiment of the present invention a lithographic printing plate can be obtained by means of the DTR-process using an imaging element comprising in the order given a grained and anodized aluminium support, an optional layer of physical development nuclei and a silver halide emulsion layer. The imaging element of the present embodiment may be imaged using a camera-exposure or a scanning exposure as described above followed by a development step in the presence of development agent(s) and silver halide solvent(s) according to the invention so that a silver image is formed in the physical development nuclei layer or directly on the aluminium support. Subsequently the silver halide emulsion layer and any other optional hydrophilic layers are removed by rinsing the imaged element with water so that the silver image is exposed. Finally the hydrophobic character of the silver image is preferably improved using a finishing liquid comprising hydrophobizing agents as described above.

To facilate the removal of the silver halide emulsion layer it is advantageous to provide a hydrophilic layer between the aluminium support and the silver halide emulsion layer. Preferably used hydrophilic layers for this purpose are layers comprising a hydrophilic non-proteinic filmforming polymers e.g. polyvinyl alcohol, polymer beads e.g. poly(meth)acrylate beads or mixtures thereof. Such type of layers are disclosed in EP-A-90202900.8 and EP-A-410500.

The present invention will now be illustrated by the following examples without however limiting it thereto. All parts are by weight unless otherwise specified.

EXAMPLE 1

Preparation of the silver halide emulsion coating solution.

A silver chlorobromide emulsion composed of 98.2% of chloride and 1.8% of bromide was prepared by the double jet precipitation method. The average silver halide grain size was 0.4 µm (diameter of a sphere with equivalent volume) and contained Rhodium ions as internal dopant. The emulsion was orthochromatically sensitized by means of compound 1 mentioned above and stabilized by 1-phenyl-5-mercapto-tetrazole.

A base layer coating solution was prepared having the following composition:

| | |
|---|---|
| gelatin | 5.5% |
| carbon black | 0.76% |
| silica particles (5 µm) | 1.6% |

Preparation of the imaging element:

The emulsion coating solution and base layer coating solution were simultaneously coated by means of the cascade coating technique to a polyethylene coated paper support provided with a pack of two backing layers such that the base layer coating was coated directly to the side of the support opposite to the side containing said backing layers. The emulsion layer was coated such that the silver halide coverage expressed as $AgNO_3$ was 1.5 $g/m^2$ and the gelatin content was 1.5 $g/m^2$. The emulsion layer further contained 0.15 $g/m^2$ of 1-phenyl-4,4'-dimethyl-3-pyrazolidone and 0.25 $g/m^2$ of hydroquinone. The base layer was coated such that the amount of gelatin in the coated layer was 3 $g/m^2$.

The layer nearest to the support of the backing layer pack contained 0.3 $g/m^2$ of gelatin and 0.5 $g/m^2$ of the antistatic agent co(tetraallyloxyethane/methacrylate/acrylic acid-K-salt) polymer. The second backing layer contained 4 $g/m^2$ of gelatin, 0.15 $g/m^2$ of a matting agent consisting of transparent spherical polymeric beads of 3 micron average diameter according to EP 0080225, 0.05 $g/m^2$ of hardening agent triacrylformal and 0.021 $g/m^2$ of wetting agent $F_{15}C_7$-COONH$_4$.

The thus obtained element was dried and subjected to a temperature of 40° C. for 5 days and then the emulsion layer was overcoated with a layer containing PdS as physical development nuclei, hydroquinone at 0.4 $g/m^2$ and formaldehyde at 100 $g/m^2$.

The following processing solutions were prepared:

| Transfer developer: | A | B |
|---|---|---|
| sodium hydroxide (g) | 30 | 30 |
| sodium sulphite anh. (g) | 33 | 33 |
| KSCN (g) | 20 | — |
| compound 3 of table 1 (g) | — | 5 |
| 2-mercapto-5-n.heptyl-oxa-3,4-diazole (g) | 0.2 | 0.2 |
| water to make | 1 l | 1 l |
| Neutralization solution | | |
| citric acid | 10 g | |
| sodium citrate | 35 g | |
| sodium sulphite anh. | 5 g | |
| phenol | 50 mg | |
| water to make | 1 l | |
| Dampening solution | | |
| water | 880 ml | |
| citric acid | 6 g | |
| boric acid | 8.4 g | |
| sodium sulphate anh. | 25 g | |
| ethyleneglycol | 100 g | |
| colloidal silica | 28 g | |

The above described imaging element was imagewise exposed and processed with one of the above described transfer developer, subsequently neutralized at 25° C. with the neutralization solution described above and dried.

The printing plates thus prepared were mounted beside each other on the same offset printing machine (Heidelberg GTO-52) so that both plates were printed under identical conditions. The ink used was Van Son Rubber base ink. During the printing run the described dampening solution was used.

It was found that the printing plate obtained with transfer developer A showed a substantial higher level of toning i.e. much more copies had to be disposed at the beginning of the printing process. The printing endurance for both plates was comparable while the staining was less for the printing plate obtained with transfer developer B.

EXAMPLE 2

2 printing plates were prepared similar to the procedure of example 1 with the exception that respectively the transfer developer C and D were used.

| Transfer developer: | A | B |
|---|---|---|
| sodium hydroxide (g) | 30 | 30 |
| sodium sulphite anh. (g) | 33 | 33 |
| KSCN (g) | 20 | — |
| compound 3 of table 1 (g) | — | 5 |
| 2-mercapto-5-n.heptyl-oxa-3,4-diazole (g) | 0.8 | 0.8 |
| water to make | 1 l | 1 l |

Both plates obtained were used to print as in example 1. It was found that silver image of the plate obtained with transfer developer C was unsuitable for printing. The plate obtained with transfer developer D yielded clear copies of excellent quality.

We claim:

1. A method for making a lithographic printing plate according to the DTR-process comprising the steps of:

information-wise exposing an imaging element comprising on a support a silver halide emulsion layer and an image-receiving layer containing physical development nuclei and developing said information-wise exposed imaging element with an alkaline processing liquid in the presence of developing agent(s), silver halide solvent(s) and hydrophobizing agent(s) characterized in that said hydrophobizing agent(s) are present in said alkaline processing liquid in a total amount of at least 0.1 g/l and wherein at least one of said silver halide solvents is a compound corresponding to the following formula:

$$Z-(R^1-S)_t-R^2-S-R^3-Y \qquad (I)$$

wherein Z and Y each independently represents hydrogen, an alkyl group, an amino group, an ammonium group, a hydroxyl, a sulfo group, a carboxyl, an aminocarbonyl or an aminosulfonyl, $R^1$, $R^2$ and $R^3$ each independently represents an alkylene that may be substituted and optionally contain a oxygen bridge and t represents an integer from 0 to 10.

2. A method according to claim 1 wherein said compound according to formula (I) is present in said alkaline processing liquid in a concentration between 0.1% and 5% by weight.

3. A method according to claim 1 wherein said hydrophobizing agents correspond to one of the following two formulas:

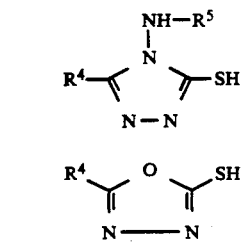

wherein $R^5$ represents hydrogen or an acyl group, $R^4$ represents alkyl, aryl or aralkyl.

4. A method according to claim 3 wherein said $R^4$ in said formula represents an alkyl containing 3 to 16 C-atoms.

5. A method according to claim 1 wherein said development is carried out in the presence of one or more alkanolamines.

6. A method according to claim 5 wherein said alkanolamines are present in a total amount of 0.1% to 5% by weight in said alkaline processing liquid and said silver halide solvents according to formula (I) are present in said alkaline processing liquid in a total amount of 0.05% by weight to 5% by weight.

* * * * *